(12) United States Patent
Galloway et al.

(10) Patent No.: US 7,700,917 B1
(45) Date of Patent: Apr. 20, 2010

(54) SPECIMEN HOLDER WITH INTEGRAL ION BEAM SCREEN AND IN SITU ADJUSTMENT

(75) Inventors: Simon Galloway, Oxford (GB); Richard Vince, Berks (GB)

(73) Assignee: Gatan, Inc., Warrendale, PA (US)

( * ) Notice: Subject to any disclaimer, the term of this patent is extended or adjusted under 35 U.S.C. 154(b) by 292 days.

(21) Appl. No.: 11/867,275

(22) Filed: Oct. 4, 2007

(51) Int. Cl.
*H01J 37/30* (2006.01)
(52) U.S. Cl. .................................. 250/310; 250/492.21
(58) Field of Classification Search .................. 250/310, 250/492.21
See application file for complete search history.

(56) References Cited

U.S. PATENT DOCUMENTS

| 5,922,179 | A | 7/1999 | Mitro et al. |
| 5,986,264 | A | 11/1999 | Grunewald |
| 6,087,274 | A * | 7/2000 | Tonucci et al. ............... 438/758 |
| 6,768,110 | B2 * | 7/2004 | Alani .......................... 250/307 |
| 6,914,244 | B2 | 7/2005 | Alani |

FOREIGN PATENT DOCUMENTS

DE        201538      6/1980

OTHER PUBLICATIONS

Alan et al., "An Updated Gas Source Focused Ion Beam Instrument for TEM Specimen Preparation," Mat Res. Soc., Symp. Proc. vol. 254, 1992 Materials Research Soc., pp. 65-78.
Ryu et al., "An Application of High Resolution FE-SEM with a Precision Etching Chamber to Failure Analysis of Semiconductor Devices," JEOL News vol. 35E No. 1, 2000, pp. 14-16.
Krehan et al., "New Ion Beam Milling System for Fast and Efficient Site Specific Sample Preparation", Microscopy & Microanalysis pp. 956-957, 10 (Suppl. 2) 2004.
Brochure, FB-2000A Focused Ion Beam System, Hitachi, pp. 1-5, Mar. 1997.

* cited by examiner

*Primary Examiner*—Kiet T Nguyen
(74) *Attorney, Agent, or Firm*—Caesar, Rivise, Bernstein, Cohen & Pokotilow, Ltd.

(57) ABSTRACT

An apparatus for holding a specimen to be viewed in a focused beam microscope, which can be an electron microscope or a focused ion beam microscope. The apparatus has a base and a specimen carriage with specimen mounting surface in a first plane and an ion beam screen or knife blade. The relative position between the ion beam screen and the specimen carriage are remotely adjustable while the apparatus is mounted in the focused beam microscope. In a further embodiment, the apparatus is transferable between an ion beam milling device and the focused beam microscope while the milling device and the microscope share a common vacuum.

16 Claims, 6 Drawing Sheets

SPECIMEN HOLDER WITH INTEGRAL ION BEAM SCREEN AND IN SITU ADJUSTMENT

FIELD OF THE INVENTION

This invention relates to ion beam milling of specimens that are prepared for viewing in a focused beam microscope such as a scanning electron microscope. More specifically it relates to a specimen holder with integral screen for ion beam milling with adjustment possible in situ within the focused beam microscope.

BACKGROUND OF THE INVENTION

Ion beam milling systems are used for the preparation of specimens whose internal and surface structures are then analyzed using a transmission electron microscope (TEM) or scanning electron microscope (SEM). Many techniques have been developed which have included the use of mechanical cutting, grinding, and/or polishing operations in combination with ion beam bombardment. In many instances, such techniques have required that the specimen be repeatedly moved from one apparatus to another (either different preparation devices or observation devices) and/or be moved or realigned while mounted in a cutting, grinding, or milling device.

Ion beam milling systems have been used to prepare specimens of various materials including ceramics, semiconductors, metals, and combinations thereof. One method of ion beam milling is slope cutting, wherein an ion beam is directed at a masking screen located at or near a specimen surface. The masking screen, which is typically mounted at an angle to the specimen surface presenting a "knife edge," protects a portion of the specimen, while the remainder of the specimen is milled by the ion beam, which passes the knife edge to reveal desired profiles. This technique is capable of providing cross-sectional profiles of layered structures, the surfaces of which can then be studied by scanning electron microscopy. For example, Hauffe, East German published Patent Application No. 201,538, teaches an apparatus and method for preparing specimens for SEM analysis by providing an ion gun inside the specimen chamber of a scanning electron microscope. A mask is positioned adjacent to the sample and is used, in conjunction with the ion gun, to remove material from the specimen.

Mitro et al, U.S. Pat. No. 5,922,179, teaches an apparatus and process for etching and coating specimens in a single vacuum chamber, to minimize handling and transfer. The apparatus includes a sealed chamber and a vacuum pump for forming and maintaining a vacuum in the chamber, a first ion gun positioned in the chamber to etch a specimen, a sputtering target in the chamber, and at least one additional ion gun positioned in the chamber to cause material from the target to be directed onto the specimen.

Techniques have also been developed in the preparation of specimens for scanning electron microscopy in which the specimen may be observed by a SEM during preparation thereof. For example, Grunewald, U.S. Pat. No. 5,986,264, ("Grunewald") teaches an ion beam milling system using two ion guns for use in the preparation of samples to be used in both SEM and TEM analysis. The system uses an SEM as a high resolution imaging device to observe the progress of the ion milling of a sample and to determine when a proper sample thickness has been achieved. Also, as the sample stage can be tilted, the system is also useful for slope cutting of specimens. Grunewald, however, does not disclose a device that allows SEM imaging of the in situ adjustment of a slope cutting screen and then ion beam milling in a dedicated ion beam milling device and subsequent high resolution imaging of the milled specimen in the SEM. Rather, Grunewald discloses "an ion beam preparation device for electron microscopy which is capable of observing the milling process in-situ with the aid of a scanning electron microscope."

All references cited herein are incorporated by reference as if fully set forth here.

Typically, ion beam milling systems require that the ion milled specimens be removed from the specimen holders for use in the milling device and loaded in a TEM or SEM holder for imaging. Clearly, loading and unloading of the specimen from the holders increases the potential of damage to fragile specimens. Multiple milling steps may be required, depending upon thickness requirements at the area of interest in the specimen, thus increasing the risks and contamination associated with transfer of the specimen. Thus, a need exists for a system wherein ion beam milling can be performed in the same vacuum environment as the focused beam microscope and where the relative position of the specimen and slope cutting screen can be adjusted in situ within the microscope for such subsequent milling.

SUMMARY OF THE INVENTION

In an exemplary embodiment the invention comprises an apparatus for holding a specimen to be viewed in focused beam microscopes, including electron microscopes and focused ion beam microscopes. The apparatus has a base and a specimen carriage with specimen mounting surface in a first plane and an ion beam screen. The relative position between the ion beam screen and the specimen carriage are remotely adjustable while the apparatus is mounted in the focused beam microscope. In a further embodiment, the apparatus is transferable between an ion beam milling device and the focused beam microscope.

In a still further embodiment, the ion beam milling device and the focused beam microscope maintain a common vacuum in which the apparatus travels when transferred between the ion milling device and the focused beam microscope.

In a further embodiment, the relative position between the ion beam screen and the specimen carriage remains fixed when the apparatus is transferred between the ion beam milling device and the focused beam microscope.

In a further embodiment, the ion beam milling is slope cutting and the ion beam screen is a knife edge.

In a further embodiment an additional mask with a slit is mounted over the specimen to limit exposure of the specimen to the ion beam.

In a further embodiment, the ion beam milling chamber provides liquid nitrogen cooling of the specimen carriage.

Other advantages and novel features of the invention will become apparent to those skilled in the art upon examination of the following detailed description of a preferred embodiment of the invention and the accompanying drawings.

DESCRIPTION OF THE DRAWINGS

FIG. 2b is a diagram of an exemplary SEM specimen chamber showing a sample module being transferred from the milling device of FIG. 2a.

FIG. 2c is a detailed view of the ion beam milling device of FIG. 2a.

DETAILED DESCRIPTION

The present invention addresses the above-described needs and limitations by providing a specimen holder for ion beam milling that has an adjustable screen or specimen carriage that can be set while the specimen holder is being viewed in an SEM chamber and transferred to an ion beam milling device without leaving the SEM vacuum environment. This provides for a contamination-free precision adjustment of the relationship between the ion beam screen and the specimen, which enables precision milling of the specimen.

Figure 1:
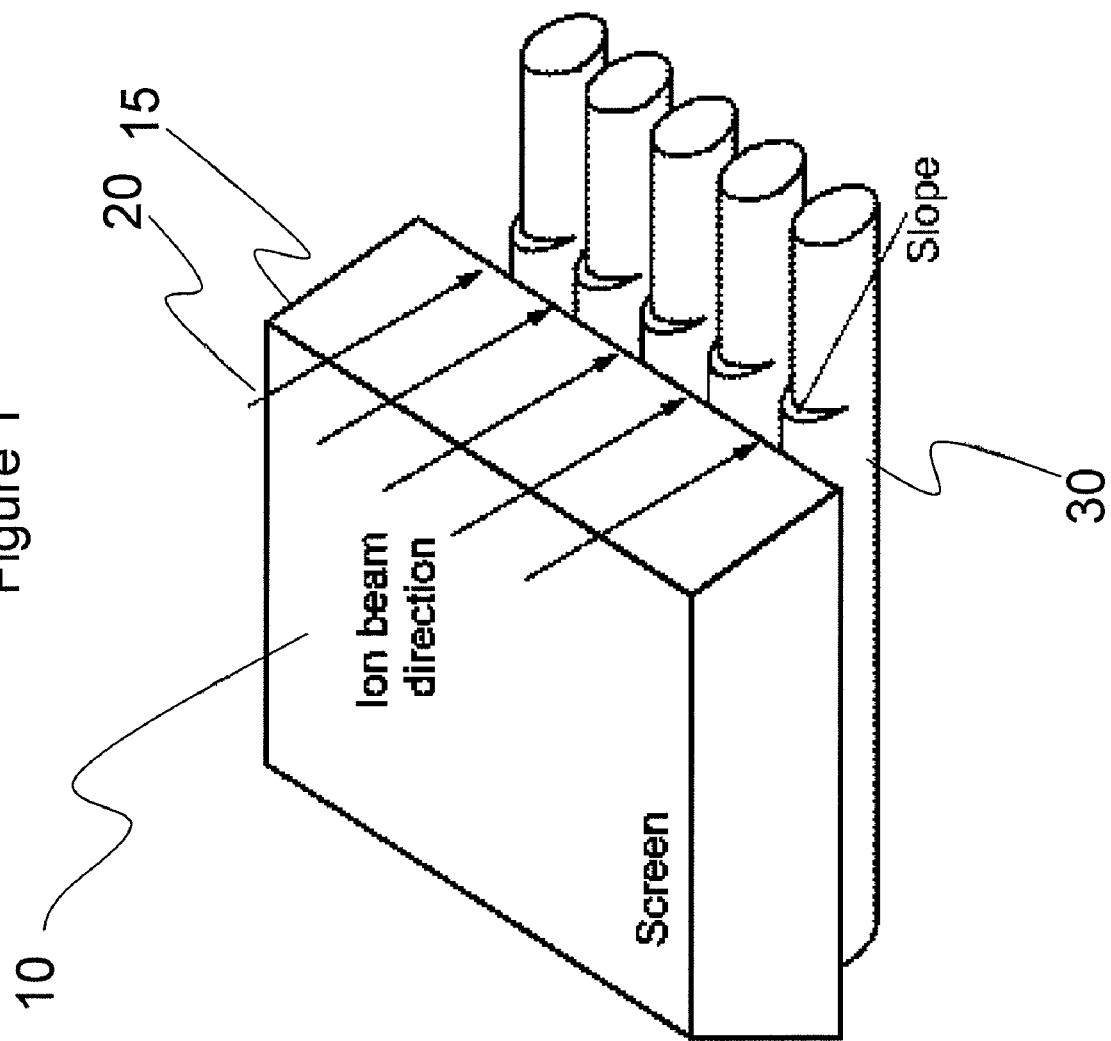
FIG. 1. is a diagram of a prior art ion beam slope cutting apparatus.

Ion beam milling is a known technique for creating cross sections of materials including metals, ceramics, carbides and composites of these materials. Ion beam milling is particularly useful in preparing cross-sectional views of integrated circuits. In a version of ion beam milling, known as slope cutting, a sample is sputtered with parallel ions across a sharp borderline determined by a screen producing a slope between the sputtered and unsputtered region. FIG. 1 shows a screen 10 with a sloped edge (knife edge) 15 across which an ion beam is 20 directed. The edge 15 of the screen 10 directs glancing ions 20 to the specimen material 30. Clearly, there is a need to align the sloped edge 15 with precision with respect to the specimen 30. Other forms of milling do not use a sloped edge, but a simple mask that presents an edge perpendicular to the specimen. One prior art method of aligning the mask or knife edge is to employ an iterative process, where the carrier on which the specimen and knife edge or mask edge are mounted is manually adjusted outside of an SEM and then viewed in the SEM for alignment. This process is repeated until the knife or mask edge and the specimen are properly aligned. After the proper alignment is confirmed in the SEM, the carrier is transferred to an ion beam device for milling. Obviously, this process is slow and undesirable as the specimen is subjected to possible damage and oxidation each time it is moved from one device to another.

Figure 2A:
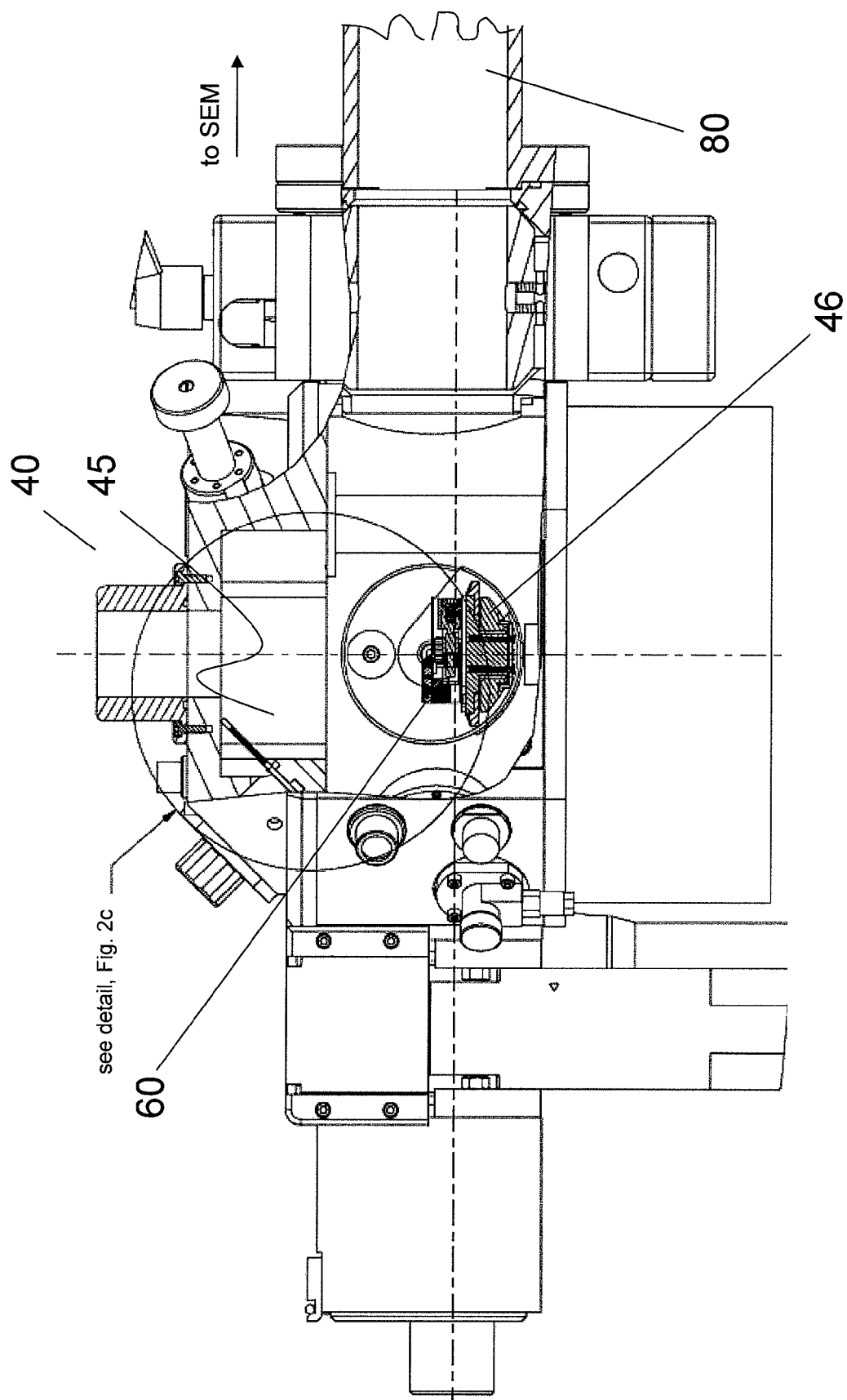
FIG. 2a. is a diagram of an embodiment of an ion beam milling device with a removable sample module that can be transferred between the SEM and the ion beam milling device.
Figure 2B:
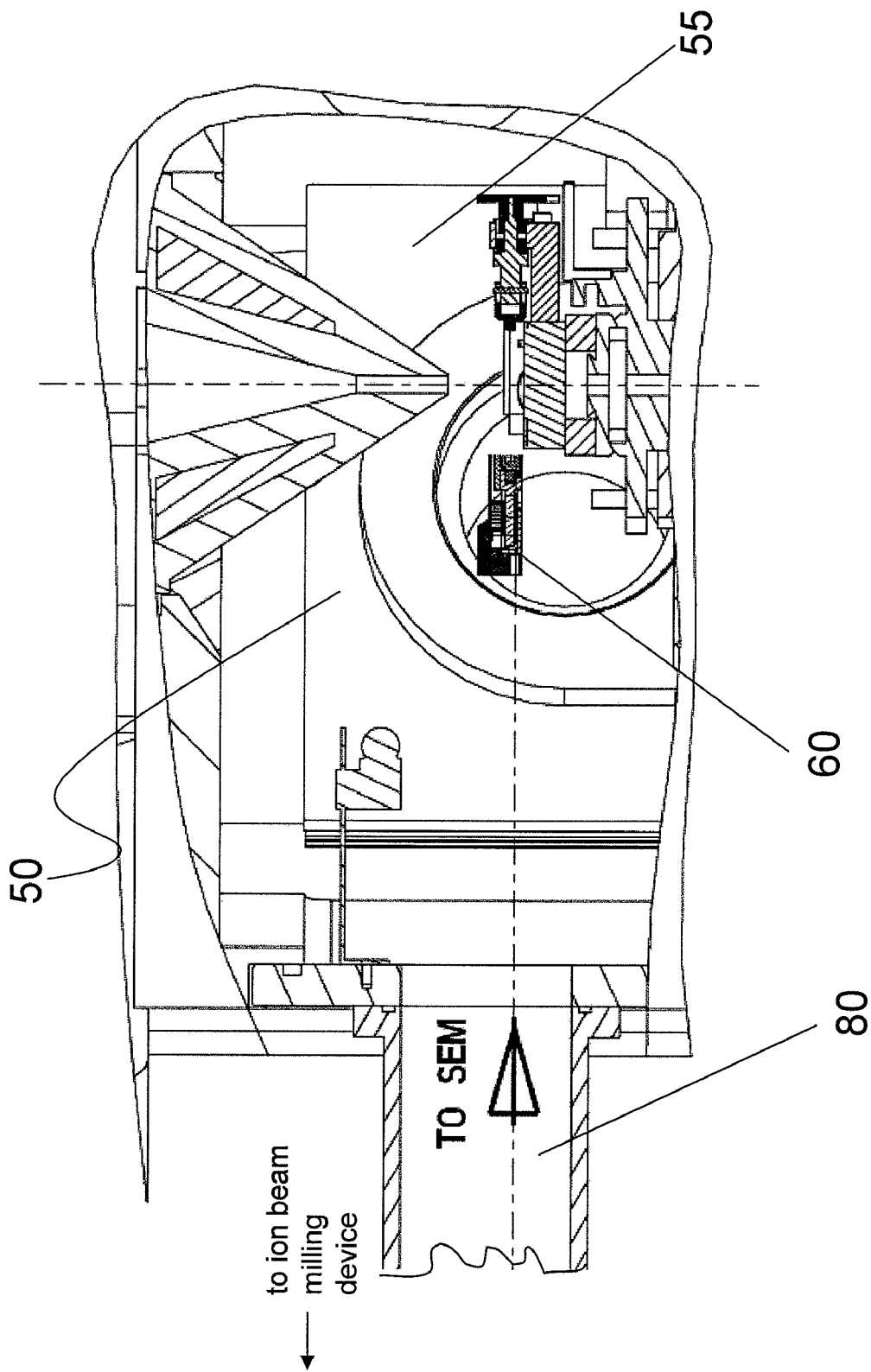
Figure 2C:
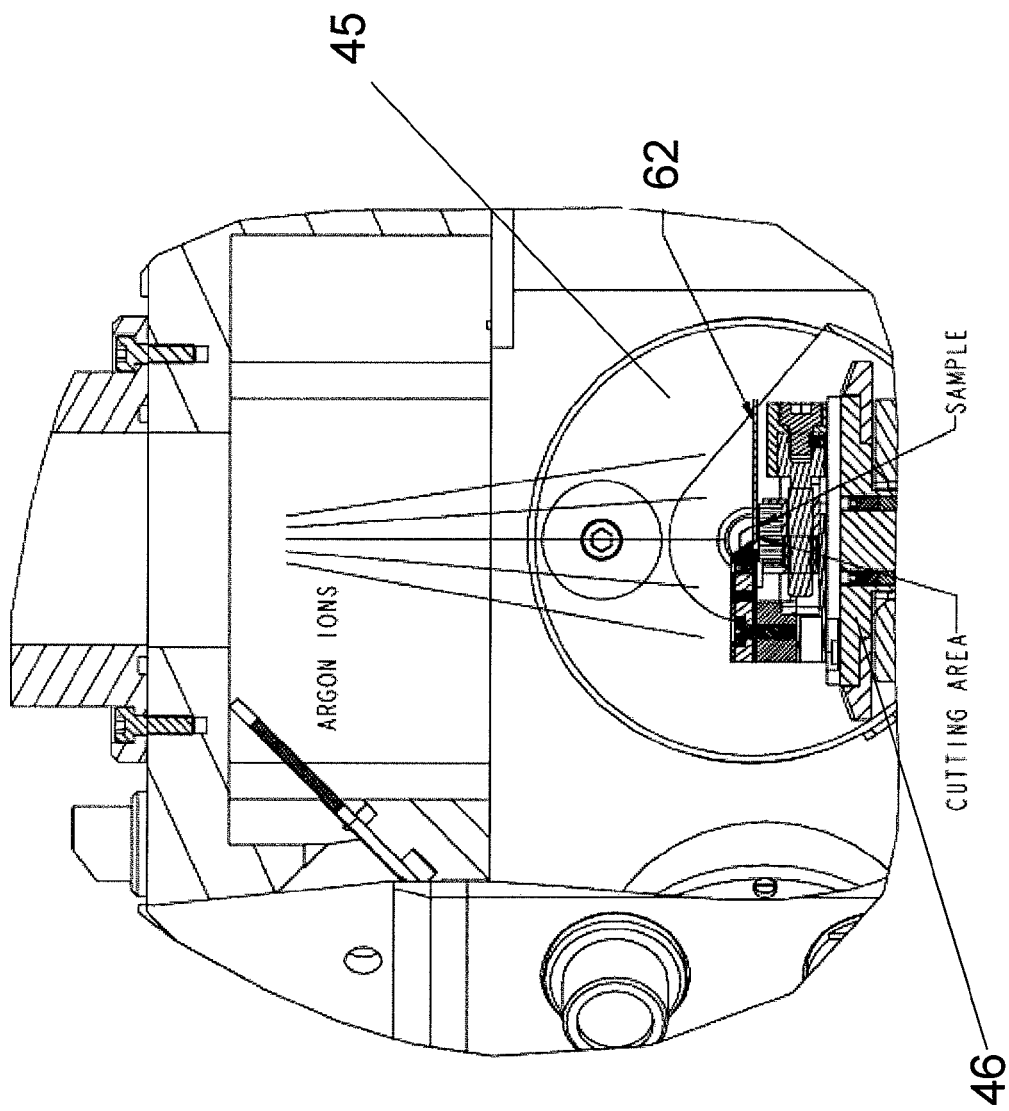

With respect to FIGS. 2a, 2b and 2c, in a preferred embodiment, an ion beam milling device 40 is attached to an SEM 50 via a common pathway 80 such that the chamber 45 of the milling device 40 and the SEM viewing chamber 55 share a common vacuum. A sample module 60 is adapted to mount in both the ion beam milling chamber 45 and the SEM viewing chamber 55. The sample module 60 is further adapted to be transferable between the two chambers, and can be transferred, for example, with a push rod (not shown) that passes through a vacuum port (not shown) to the outside of the ion beam milling device 40.

Figure 3:
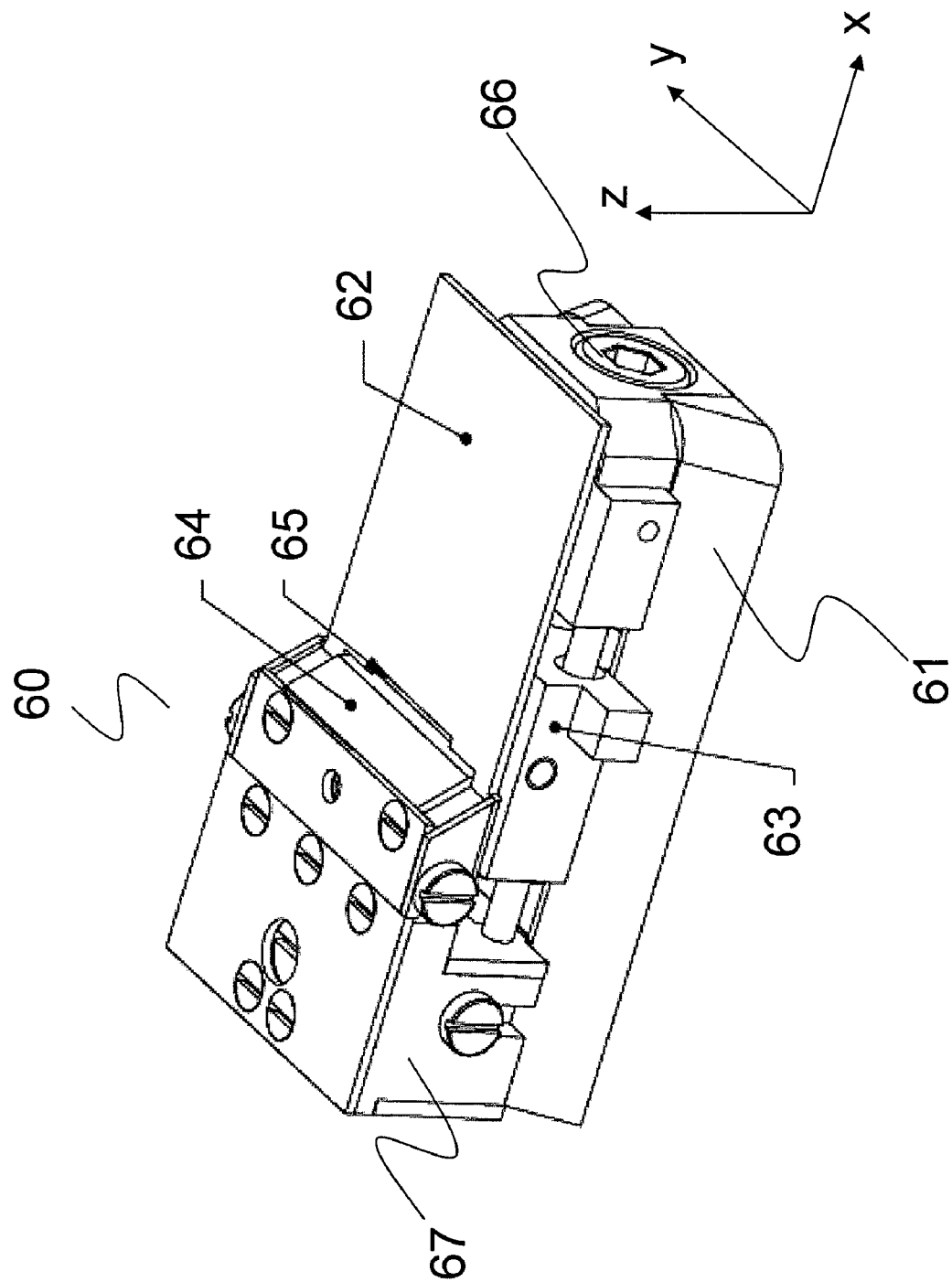
FIG. 3. is a diagram of an exemplary sample module.
Figure 4:
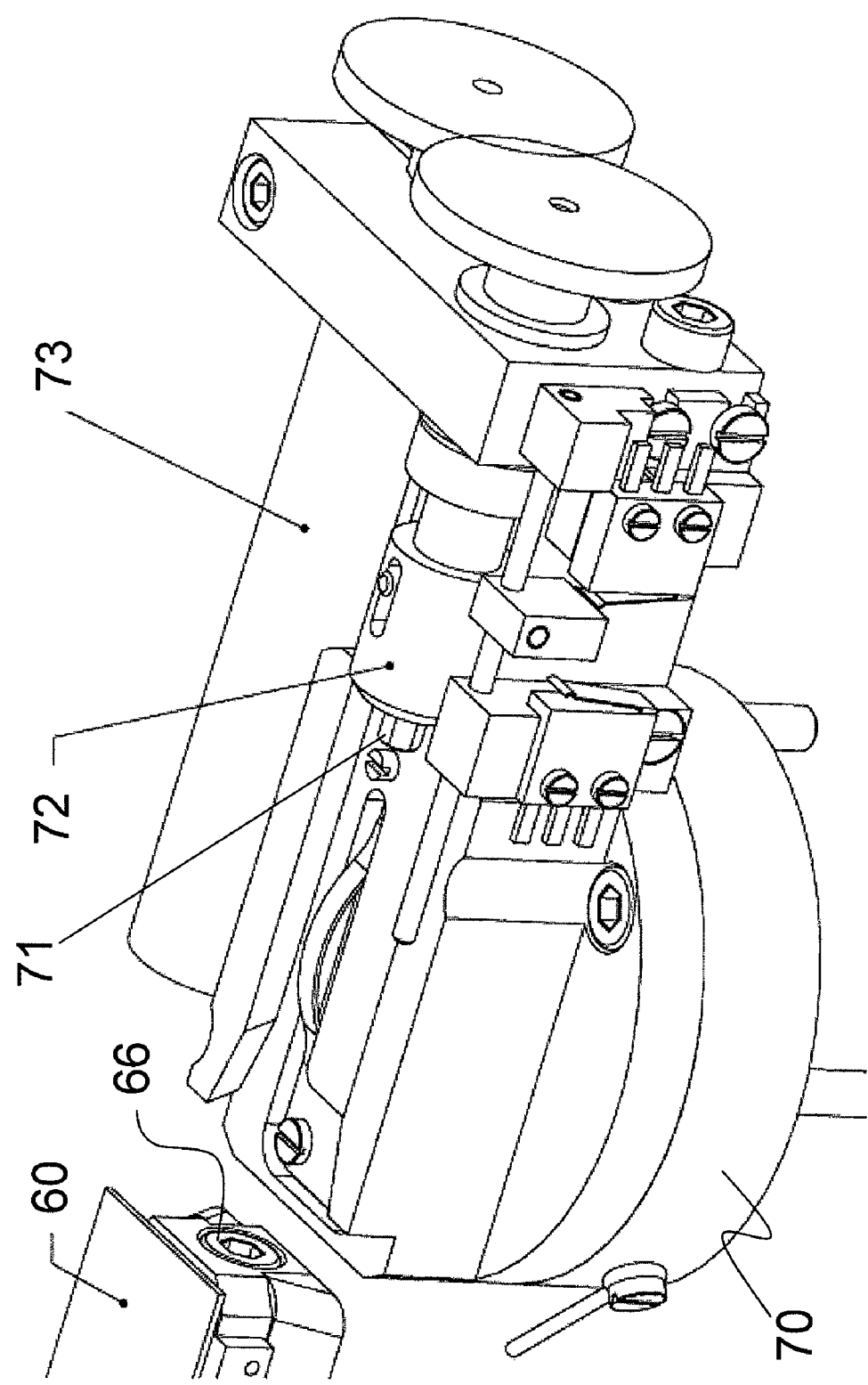
FIG. 4. is a diagram of an exemplary SEM motorized adjustment stage.

FIG. 3 shows an exemplary sample module 60. The sample module has a mounting base 61, a specimen mask 62, a sample carriage 63 and a screen 64. In this embodiment, the screen comprises a knife edge. The screen 64 is attached to a screen mount 67. A slit 65 in the specimen mask 62 allows some ions to pass through to the sample carriage 63 below, on which a sample to be milled (not shown) is attached. The specimen mask limits exposure of the specimen to the ion beam. In various embodiments, either the sample carriage 63 or the screen mount 67, or both are adjustable along the lengthwise (x) axis of the sample module. In the embodiment shown in FIG. 3, the sample carriage is adjustable. An adjustment head 66 is attached to a mechanical adjustment mechanism internal to the sample module 60 (not shown) for moving the sample carriage 63 back and forth with fine precision. As shown, the adjustment head 66 is designed to accept a hexagonal allen key. Other adjustment fittings are also possible. When the sample module 60 is outside of the ion milling device and SEM, the adjustment head 66 can be manually actuated with an allen key or the like. When the sample module is mounted in the SEM stage, the adjustment head is remotely actuated by an electrically powered actuator. As shown in FIG. 4, the actuator has a fitting 71 compatible with the adjustment head 66. The fitting 71 is at the end of the drive shaft 72 of an electrically powered actuator 73 that is mounted on the SEM stage. Thus, when the sample module 60 is mounted in the SEM chamber 55, the sample carriage is remotely adjustable while the sample is being viewed in the SEM. This allows for precision adjustment of the sample in relation to the beam screen 64. Typically an adjustment speed for the sample carriage of one micron per second or less is desired. As noted above, in another embodiment the sample module can be adapted such that the screen mount 67 is adjustable instead of the sample carriage. In a further embodiment, both the sample carriage and the screen mount are adjustable.

Because the sample module 60 can be moved between the ion beam milling chamber 45 and the SEM chamber 55 in a continuous vacuum, milling progress can be viewed and sample position adjusted accordingly without removing the sample from the vacuum. One reason that this feature is desirable is that removal of the sample from the vacuum can cause unwanted oxidation or hydration of the sample surface or coating. Loading a specimen from an ion beam milling chamber to an SEM chamber via an airlock is known in the art (See JEOL News Vol. 35, No. 1 p. 14 (2000)), but a specimen carrier that is adjustable has not been done before.

In an exemplary embodiment, the ion beam milling device has an actuated mount 46 (FIG. 2c) that accepts the sample module. As one skilled in the art will recognize, there are milling operations wherein it is desirable to rock the sample. With respect to FIG. 3, the rocking is about the x axis. The actuated mount is designed to rock the sample module about an axis within the eucentric height as defined by the rock axis with respect to the width of the incident ion beam.

In a further embodiment, the sample carriage is manually adjustable under an optical microscope with the sample module outside of the ion beam milling chamber. This allows the operator to adjust the angle of the sample about the z axis with respect to the knife edge.

In a further embodiment, that may include any of the above described features, the actuated mounting stage 46 in the ion beam milling device is cooled with liquid nitrogen which in turn cools the sample module and sample, which are thermally coupled to the mounting stage 46.

While the description above refers in many instances to an SEM, the invention is not limited to applications involving an SEM, and includes all forms of focused beam microscopes.

While the invention has been described in detail and with reference to specific examples thereof, it will be apparent to one skilled in the art that various changes and modifications can be made therein without departing from the spirit and scope thereof.

We claim:

1. An apparatus for holding a specimen to be viewed in a focused beam microscope comprising:
   a base;
   a specimen carriage having a specimen mounting surface in a first plane; and
   an ion beam screen;

wherein said ion beam screen has a position relative to said specimen carriage and wherein said relative position between said ion beam screen and said specimen carriage is adjustable in situ within the focused beam microscope.

2. The apparatus of claim 1, wherein the apparatus is transferable between an ion beam milling device and the focused beam microscope.

3. The apparatus of claim 2, wherein said ion beam milling device and the focused beam microscope maintain a common vacuum in which said apparatus travels when transferred between said ion milling device and the focused beam microscope.

4. The apparatus of claim 2, wherein said relative position between said ion beam screen and said specimen carriage remains fixed when the apparatus is transferred between said ion beam milling device and the focused beam microscope.

5. The apparatus of claim 1 wherein at least one of said specimen carriage and said ion beam screen is directly connected to a linear translation mechanism.

6. The apparatus of claim 5 wherein said linear translation mechanism is manually adjustable when the apparatus is outside of said focused beam microscope.

7. The apparatus of claim 5 wherein said linear translation mechanism is remotely adjustable when the apparatus is installed in said focused beam microscope.

8. The apparatus of claim 1 wherein said ion beam screen comprises an edge that is parallel to said first plane and either said specimen carriage or said screen is adapted to be rotated about an axis that is perpendicular to said first plane.

9. The apparatus of claim 1, wherein said ion beam screen is a knife blade, said knife blade being adapted to be mounted at a fixed angle with respect to said first plane and wherein said base is adapted to accept any one of a plurality of knife blades that are each adapted to be mounted at a different angle with respect to said first plane.

10. The apparatus of claim 1, further comprising a specimen mask, wherein said specimen mask is positioned to cover regions of the specimen to be protected from an ion beam.

11. A system for ion beam milling of a specimen comprising:
    a preparation chamber for ion beam milling, comprising a first module mount;
    a focused beam microscope comprising an attachment port and a translation stage;
    said translation stage comprising a second module mount; and a
    sample module, comprising a base, a specimen carriage and an ion beam screen;
    wherein said preparation chamber and said focused beam microscope are directly connected at said attachment port and adapted to allow said sample module to be transferable between said first module mount and said second module mount, and wherein said ion beam screen has a position relative to said specimen carriage and wherein said relative position between said ion beam screen and said specimen carriage is adjustable.

12. The system of claim 11 wherein said preparation chamber and said focused beam microscope maintain a common vacuum and are adapted to allow said sample module to be transferable between said first module mount and said second module mount within said common vacuum.

13. The system of claim 11 wherein said sample module further comprises a linear translation mechanism that is directly connected to one of said specimen carriage or said ion beam screen.

14. The system of claim 13, wherein said translation stage further comprises a motor adapted to engage with and move said linear translation mechanism while said sample module is in said second module mount.

15. The system of claim 11, wherein said preparation chamber further comprises a liquid nitrogen cooler for said first module mount.

16. The system of claim 11, wherein the ion beam milling is slope cutting and said ion beam screen comprises a knife edge.

* * * * *